(12) United States Patent
Kitayama et al.

(10) Patent No.: US 11,318,519 B2
(45) Date of Patent: May 3, 2022

(54) PRESS SYSTEM AND METHOD OF CONTROLLING THE SAME

(71) Applicant: KOMATSU INDUSTRIES CORPORATION, Kanazawa (JP)

(72) Inventors: Satoshi Kitayama, Kanazawa (JP); Takuya Noda, Kanazawa (JP); Takuji Miyasaka, Kanazawa (JP); Takahiro Noguchi, Tokyo (JP); Kiichiro Kawamoto, Kanazawa (JP)

(73) Assignee: KOMATSU INDUSTRIES CORPORATION, Kanazawa (JP)

( * ) Notice: Subject to any disclaimer, the term of this patent is extended or adjusted under 35 U.S.C. 154(b) by 237 days.

(21) Appl. No.: 16/615,621

(22) PCT Filed: Aug. 21, 2018

(86) PCT No.: PCT/JP2018/030736
§ 371 (c)(1),
(2) Date: Nov. 21, 2019

(87) PCT Pub. No.: WO2019/049649
PCT Pub. Date: Mar. 14, 2019

(65) Prior Publication Data
US 2020/0078847 A1 Mar. 12, 2020

(30) Foreign Application Priority Data
Sep. 11, 2017 (JP) .............................. JP2017-174127

(51) Int. Cl.
*B21D 24/14* (2006.01)
*B21D 24/02* (2006.01)
(Continued)

(52) U.S. Cl.
CPC ............. *B21D 24/14* (2013.01); *B21D 24/02* (2013.01); *G05B 13/042* (2013.01); *G05B 19/18* (2013.01);
(Continued)

(58) Field of Classification Search
CPC ...... B21D 24/14; B21D 24/02; G05B 13/042; G05B 19/18; G05B 19/406; G05B 2219/2622; G06F 30/00
See application file for complete search history.

(56) References Cited

U.S. PATENT DOCUMENTS

2005/0143962 A1* 6/2005 Keane ..................... G06F 30/00
703/1
2009/0025449 A1 1/2009 Onishi
(Continued)

FOREIGN PATENT DOCUMENTS

CN            101389421 A      3/2009
CN            102036765 A      4/2011
(Continued)

*Primary Examiner* — Charles R Kasenge
(74) *Attorney, Agent, or Firm* — Faegre Drinker Biddle & Reath LLP

(57) ABSTRACT

A press system includes a press portion and a controller configured to control the press portion. The controller includes a load pattern generator, an evaluation input unit, and an optimum load pattern setting unit configured to set an optimum load pattern based on a plurality of evaluations of the quality input by the evaluation input unit. The optimum load pattern setting unit includes a response surface generator configured to create from evaluation value data based on the plurality of load patterns and the plurality of evaluations of the quality, by using as an objective function, the evaluation value data with the load pattern being defined as a design variable, a response surface of the objective function, and an optimization calculator configured to find an optimum solution of the objective function of the response surface by optimization.

11 Claims, 9 Drawing Sheets

(51) Int. Cl.
    *G05B 19/406*     (2006.01)
    *G06F 30/00*     (2020.01)
    *G05B 19/18*     (2006.01)
    *G05B 13/04*     (2006.01)

(52) U.S. Cl.
    CPC ........... *G05B 19/406* (2013.01); *G06F 30/00* (2020.01); *G05B 2219/2622* (2013.01)

(56) References Cited

U.S. PATENT DOCUMENTS

| | | | |
|---|---|---|---|
| 2010/0089119 A1* | 4/2010 | Nagai | B21D 22/02 |
| | | | 73/9 |
| 2011/0045113 A1 | 2/2011 | Miyasaka et al. | |
| 2014/0222749 A1* | 8/2014 | Fernandez Martinez | ................... |
| | | | G06N 5/048 |
| | | | 706/52 |

FOREIGN PATENT DOCUMENTS

| | | | |
|---|---|---|---|
| CN | 103357734 A | 10/2013 |
| CN | 105260532 A | 1/2016 |
| EP | 00692323 B1 | 10/1999 |
| JP | 2006-167766 A | 6/2006 |
| JP | 2009-136880 A | 6/2009 |
| JP | 2010-46684 A | 3/2010 |
| JP | 2016-200901 A | 12/2016 |

* cited by examiner

WRINKLE    CRACK

| EXECUTION: | SATISFIED | SOMEWHAT UNSATISFIED | UNSATISFIED |
| WRINKLE: | NONE | A FEW | YES |
| CRACK: | NONE | A FEW | YES |

OK

PRESS SYSTEM AND METHOD OF CONTROLLING THE SAME

TECHNICAL FIELD

The present invention relates to a press system and a method of controlling a press apparatus, and particularly to control of a load pattern for a servo die cushion or the like.

BACKGROUND ART

Quality of a formed product can be improved by employing a servo die cushion in which a die cushion is controlled by a servo motor and a load can arbitrarily be changed and changing a die cushion load during press forming.

In order to find optimum change in die cushion load, however, many trials have been required and hence huge efforts have been required.

Japanese Patent Laying-Open No. 2016-200901 has proposed a scheme to create an approximate model of a structure having optimum material characteristics by optimizing a parameter defining the material.

In adopting an optimization approach, conventionally, an analysis tool has often been used together.

In using an analysis tool, one has to be well-versed in the analysis tool in order to lessen an analysis error, and it has been difficult to accurately set an optimum load pattern.

CITATION LIST

Patent Literature

PTL 1: Japanese Patent Laying-Open No. 2016-200901

SUMMARY OF INVENTION

Technical Problem

An object of the present invention is to provide a press apparatus in which a load pattern can efficiently be set with a simplified scheme and a method of controlling the same.

Solution to Problem

A press system according to one aspect includes a press portion and a controller configured to control the press portion. The controller includes a load pattern generator configured to generate a plurality of load patterns, an evaluation input unit configured to input evaluation of quality of each of a plurality of formed products formed by the press portion in accordance with a plurality of load patterns, and an optimum load pattern setting unit configured to set an optimum load pattern based on a plurality of evaluations of the quality input by the evaluation input unit. The optimum load pattern setting unit includes a response surface generator configured to create from evaluation value data based on the plurality of load patterns and the plurality of evaluations of the quality, by using as an objective function, the evaluation value data with the load pattern being defined as a design variable, a response surface of the objective function and an optimization calculator configured to find an optimum solution of the objective function of the response surface by optimization.

A press system according to one aspect includes a press portion and a controller configured to control the press portion. The controller includes a speed pattern generator configured to generate a plurality of speed patterns of a slide of the press portion, an evaluation input unit configured to input evaluation of quality of each of a plurality of formed products formed by the press portion in accordance with a plurality of speed patterns, and an optimum speed pattern setting unit configured to set an optimum speed pattern based on a plurality of evaluations of the quality input by the evaluation input unit. The optimum speed pattern setting unit includes a response surface generator configured to create from evaluation value data based on the plurality of speed patterns and the plurality of evaluations of the quality, by using as an objective function, the evaluation value data with the speed pattern being defined as a design variable, a response surface of the objective function and an optimization calculator configured to find an optimum solution of the objective function of the response surface by optimization.

Advantageous Effects of Invention

According to the press system and the method of controlling a press apparatus, a load pattern can efficiently be set with a simplified scheme.

DESCRIPTION OF EMBODIMENTS

Figure 1:
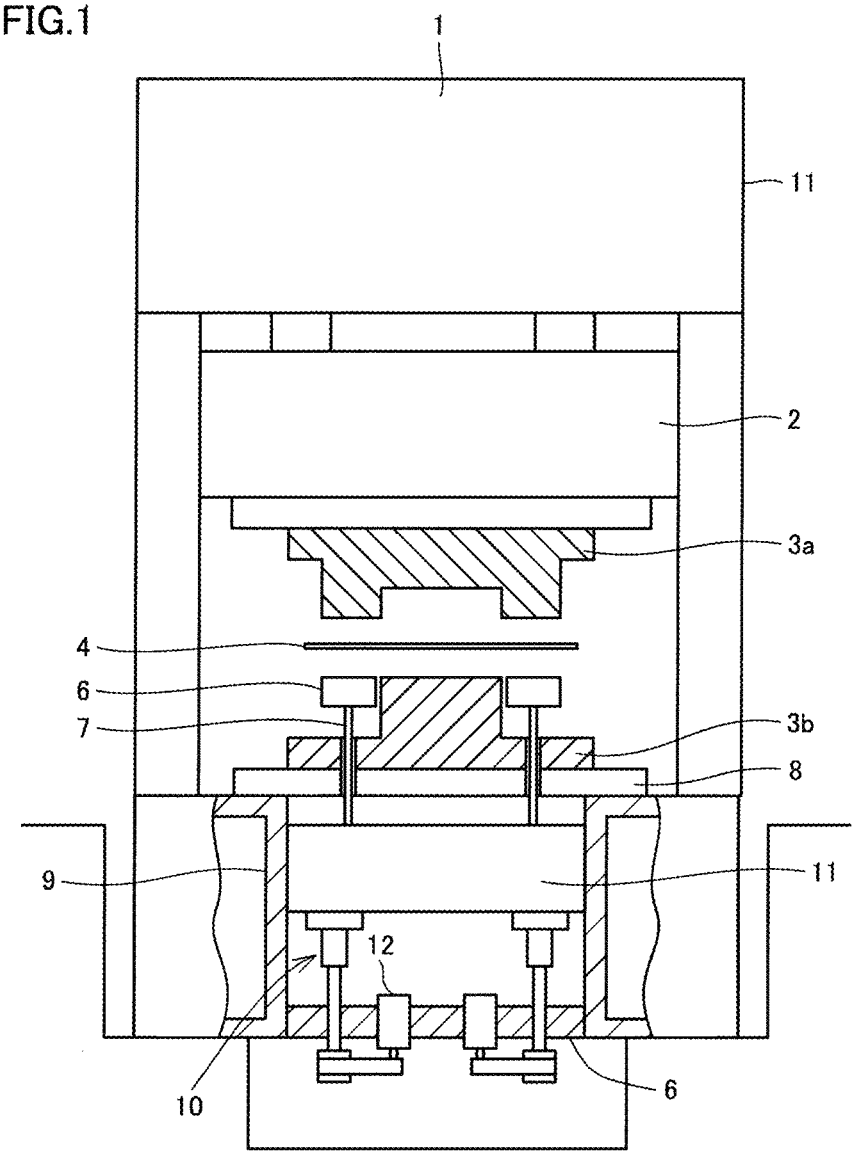
FIG. 1 is a schematic diagram of a press apparatus based on an embodiment.

An embodiment will be described below with reference to the drawings. In the description below, the same elements have the same reference characters allotted and their label and function are also the same. Therefore, detailed description thereof will not be repeated.

An embodiment of the present example will be described below with reference to the drawings.

FIG. 1 is a schematic diagram of a press apparatus based on the embodiment.

As shown in FIG. 1, the press apparatus is provided with a slide 2 located above and a bolster 8 located below as being opposed to each other.

Slide 2 performs an upward and downward operation by receiving motive power from a slide drive mechanism 1 contained in a crown 11 located above.

An upper die 3a is attached under slide 2. Bolster 8 is fixed onto a bed 9, and a lower die 3b is attached onto bolster 8.

In bolster 8 and lower die 3b, a plurality of holes which pass therethrough in a vertical direction are provided, and a cushion pin 7 is inserted in the hole.

Cushion pin 7 has an upper end abutting on a lower portion of a blank holder 5 provided in a recessed portion in lower die 3b and has a lower end abutting on a cushion pad 11 of a die cushion 10 provided in bed 9.

A beam 6 is provided between inner wall surfaces of bed 9 and supports die cushion 10.

In press working, a workpiece (blank) 4 is placed on blank holder 5.

As upper die 3a is lowered together with slide 2, a projection of upper die 3a and workpiece 4 abut on each other.

Then, workpiece 4 is sandwiched between the projection of upper die 3a and blank holder 5 to perform blank holding. As slide 2 and upper die 3a are lowered, workpiece 4 is drawn by upper die 3a and lower die 3b.

At this time, cushion pad 11, cushion pin 7, and blank holder 5 are integrally lowered while they generate upward biasing force.

A servo motor 12 is provided for cushion pad 11, and electrically powered servo motor 12 is used to generate a cushion pressure.

A control system for slide 2 and cushion pad 11 will be described.

Slide drive mechanism 1 has slide 2 perform an upward and downward operation in accordance with a command current output from a control unit 34 which will be described later.

Servo motor 12 has cushion pad 11 perform an upward and downward operation in accordance with a command current supplied from control unit 34.

A memory 33 which will be described later stores information on a prescribed upward and downward operation for controlling slide 2 and cushion pad 11 in association.

For example, memory 33 stores relation between temporal change and position change per one stroke of slide 2, relation between temporal change and position change per one stroke of cushion pad 11, and relation between temporal change and pressure change in cushion pad 11 during drawing. Slide 2 and cushion pad 11 are identical to each other in time required for one stroke. Therefore, upward and downward operations by slide 2 and cushion pad 11 are in synchronization with each other. An operator can modify setting for the upward and downward operations by slide 2 and cushion pad 11 by using a not-shown input apparatus.

Control unit 34 controls a position of slide 2 and controls a position of and a pressure (load) applied to cushion pad 11.

In the embodiment, control of a position of and a load applied to cushion pad 11 will be described.

Figure 2:
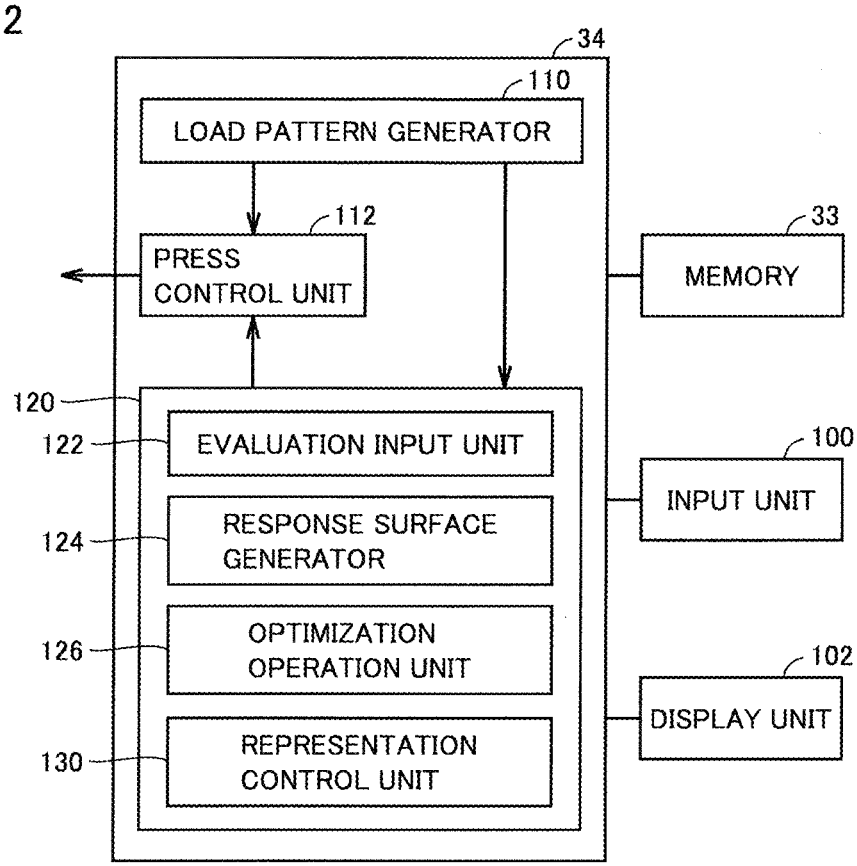
FIG. 2 is a diagram illustrating a control unit 34 and a component around the same based on the embodiment.

FIG. 2 is a diagram illustrating control unit 34 and a component around the same based on the embodiment.

Referring to FIG. 2, memory 33, an input unit 100, and a display unit 102 are provided around control unit 34.

Input unit 100 refers to various input devices such as a mouse and a keyboard for inputting various types of information in response to an instruction from an operator.

Known various displays are employed for display unit 102.

Though input unit 100 and display unit 102 can also be provided separately from each other, a touch panel type display is provided in the present example.

Control unit 34 performs various functions based on a program stored in memory 33. Control unit 34 performs various functions by executing a program (computer software) stored in a ROM or the like of memory 33 or the like. The control unit may be implemented by a computer in which each component functions as a result of execution of a program or by a dedicated apparatus in which each component is implemented by a dedicated circuit.

Specifically, control unit 34 includes a load pattern generator 110 for cushion pad 11, a press control unit 112 configured to control press working, and an optimum load pattern setting unit 120.

Load pattern generator 110 generates a plurality of load patterns for cushion pad 11 for forming a formed product to be employed as a sample based on input of various conditions through input unit 100.

In the present example, conditions such as an upper limit load, a lower limit load, the number of divisions of a forming stroke, and a position of division of the forming stroke for cushion pad 11 are input.

Press control unit 112 controls slide drive mechanism 1 and servo motor 12. Specifically, the press control unit outputs a command current for performing desired press working.

Optimum load pattern setting unit 120 sets an optimum load pattern for cushion pad 11.

Figure 3:
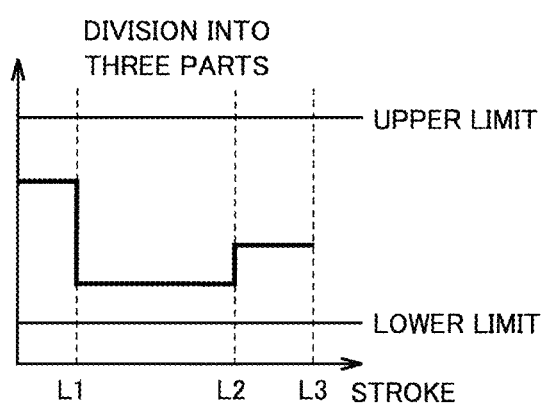
FIG. 3 is a diagram illustrating a condition input to a load pattern generator 110 based on the embodiment.

FIG. 3 is a diagram illustrating a condition input to load pattern generator 110 based on the embodiment.

As shown in FIG. 3, the upper limit load, the lower limit load, the number of divisions of a forming stroke, and positions of division of the forming stroke L1, L2, and L3 for cushion pad 11 are input as conditions.

In the present example, the number of divisions of a forming stroke is set to "three".

Figure 4:
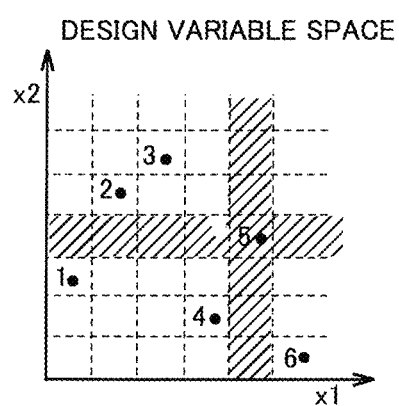
FIG. 4 is a diagram illustrating a scheme of generation of a load pattern by load pattern generator 110 based on the embodiment.

FIG. 4 is a diagram illustrating a scheme of generation of a load pattern by load pattern generator 110 based on the embodiment.

As shown in FIG. 4, a value of a design variable represented by a load pattern such as a parameter value is set by Latin hypercube design (LHD) and an orthogonal array. Latin hypercube design refers to a sampling approach with which a design variable space is discretely and evenly filled. Though an example in which two parameter values of x1 and x2 are set is shown, the number of parameter values to be used for generating a load pattern in accordance with input conditions is set. Therefore, parameter values can evenly be set in the design variable space. In addition to Latin hypercube design, for example, an orthogonal array or a Monte Carlo method can also be used to set a parameter value of a design variable.

Figure 5:
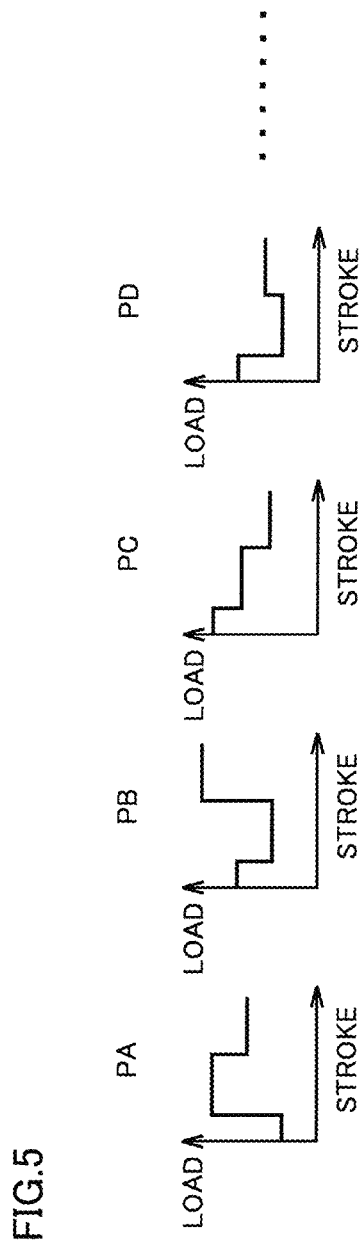
FIG. 5 is a diagram illustrating a plurality of load patterns based on the embodiment.

FIG. 5 is a diagram illustrating a plurality of load patterns based on the embodiment.

As shown in FIG. 5, load pattern generator 110 generates a plurality of load patterns PA to PD for cushion pad 11 by Latin hypercube design based on the input conditions including the upper limit load, the lower limit load, the number of divisions of a forming stroke, and positions of division of the forming stroke. Though the present example shows four load patterns, the number of load patterns is set in accordance with the input conditions.

In the present example, press forming is actually performed in accordance with load patterns PA to PD generated by load pattern generator 110.

Press control unit 112 controls servo motor 12 in accordance with load patterns PA to PD for cushion pad 11. Press control unit 112 controls slide drive mechanism 1 such that slide 2 is operated to carry out a prescribed slide motion. Specifically, the press control unit outputs a command current for performing desired press working.

Figures 6, 7:
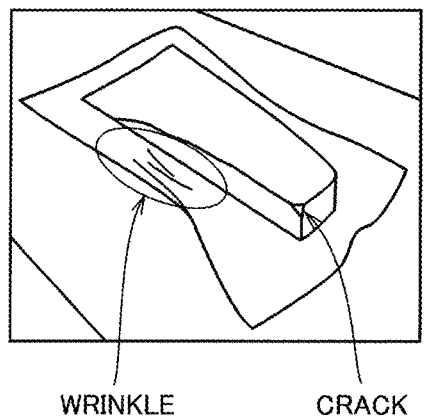
FIG. 6 is a diagram illustrating one example of a sample product based on the embodiment.
FIG. 7 is a diagram illustrating an evaluation screen based on the embodiment.

FIG. 6 is a diagram illustrating one example of a sample product based on the embodiment.

FIG. 6 shows a sample product press formed in a certain load pattern for cushion pad 11.

A sample product is formed by using a die for each generated load pattern. In the present example, an operator performs sensory evaluation of quality of each sample product made by press forming.

Specifically, three indicators are set, and sensory evaluation of quality of "execution", "wrinkle", and "crack" of sample products is performed.

FIG. 7 is a diagram illustrating an evaluation screen based on the embodiment.

As shown in FIG. 7, an operator performs sensory evaluation of quality of "execution", "wrinkle", and "crack" of press formed sample products.

In the present example, evaluation options of "satisfied", "somewhat unsatisfied," and "unsatisfied" are provided for quality of "execution" by way of example. Evaluation options of "none", "a few," and "yes" are provided for quality of "wrinkle". Evaluation options of "none", "a few," and "yes" are provided for quality of "crack".

Each of the evaluation options is associated with evaluation data in advance.

Specifically, regarding quality of the sample products, by way of example, evaluation data "−0.5", "0.5", and "1.5" are allocated to the evaluation options of "satisfied", "somewhat unsatisfied," and "unsatisfied" in connection with quality of "execution", respectively.

Regarding quality of the sample products, by way of example, evaluation data "−0.5", "0.5", and "1.5" are allocated to the evaluation options of "none", "a few," and "yes" in connection with quality of "wrinkle", respectively.

Regarding quality of the sample products, by way of example, evaluation data "−0.5", "0.5", and "1.5" are allocated to the evaluation options of "none", "a few," and "yes" in connection with quality of "crack", respectively.

An operator evaluates quality of a plurality of sample products formed in a plurality of load patterns generated by load pattern generator 110. Though the present example describes evaluation of quality of the sample products in three levels, limitation thereto is not particularly intended and the quality may be evaluated in two levels or more levels.

Characteristic data in which a plurality of load patterns are associated with a plurality of pieces of evaluation data based on sensory evaluation by an operator is thus obtained.

In the present example, by using as an objective function, evaluation data with a load pattern being defined as a design variable, a response surface of the objective function is created based on a plurality of pieces of obtained characteristic data.

Specifically, a response surface with "execution" being defined as an objective function is created.

In addition, a response surface with "wrinkle" being defined as a constraint function is created.

Furthermore, a response surface with "crack" being defined as a constraint function is created.

An augmented objective function is created by a method similar to the penalty method, by handling a constraint condition as a penalty function. Similarly, a response surface of the augmented objective function is created, and an optimum solution is found by minimizing the response surface.

An approach to optimization of an objective function having a constraint condition is not particularly limited as such, and another approach can also be employed.

Another quality of forming and a general indicator on which evaluation can be based can be employed as an objective function or a constraint condition, and examples thereof include surface strain, line displacement, shear droop, local warping, a shock line, spring back, poor dimension accuracy, a cycle time, and power consumption.

Through such processing, a load pattern corresponding to the optimum solution is set and press forming is performed. The response surface is successively updated by adding characteristic data of a press formed product.

The response surface and the objective function are thus approximated to each other and accuracy can be improved.

The present example describes obtaining characteristic data in which a plurality of load patterns are associated with a plurality of pieces of evaluation data based on sensory evaluation by an operator and creating based on a plurality of pieces of the obtained characteristic data, by using as an objective function, evaluation data with the load pattern being defined as a design variable, a response surface of the objective function, by way of example. In contrast, without being particularly limited to sensory evaluation, a value obtained by actual measurement can also be used. Specifically, a measurement value itself serving as an indicator of quality of forming or a measurement value highly associated therewith may be input, that measurement value may be adopted as an objective function or a constraint condition, and a response surface of the objective function and the constraint condition may be created.

Optimization calculation will now be described.

In the present example, optimum load pattern setting unit 120 performs processing.

Optimum load pattern setting unit 120 includes an evaluation input unit 122, a response surface generator 124, an optimization operation unit 126, and a representation control unit 130.

Evaluation input unit 122 accepts input of evaluation of a formed product. As described above, input of evaluation is associated with evaluation data, and evaluation data is obtained in accordance with the input.

Evaluation data input by evaluation input unit 122 represents a quantity to be evaluated, that is, an objective function. The objective function has a direction favorable as capability, and examples of the direction include a direction of increase in value, a direction of decrease in value, a direction closer to a prescribed value. The objective function also has an unfavorable direction which is opposite to the favorable direction, other than the favorable direction described above. In the present example, an optimum solution in the direction favorable as capability is obtained.

For a press formed product, a load pattern value closer to execution being evaluated as satisfied, wrinkle being evaluated as none, and crack being evaluated as none is regarded as an optimum solution.

For a press formed product, a load pattern is adopted as a design variable. Specifically, a parameter value of the design variable includes an upper limit load, a lower limit load, the number of divisions of a forming stroke, and a position of division of the forming stroke input for generating a load pattern.

The constraint condition refers to a condition for constraining a value of the objective function to be within a prescribed range and for constraining a value of the design variable to be within a prescribed range.

Response surface generator 124 generates a response surface of an objective function with respect to a design variable.

Response surface generator 124 calculates an output value (sampling point) in a characteristic value space including a plurality of types of design variable values (parameter values). Specifically, response surface generator 124 uses a design variable and an output value (a sampling point) to create an approximate model (a response surface) with a characteristic value represented by the output value being defined as an objective function.

Optimization operation unit 126 sets an optimization condition for obtaining an optimum solution, such as a condition for searching for an optimum solution. The condition for search for an optimum solution includes an approach to search for an optimum solution and various conditions for search for an optimum solution.

In the present embodiment, for example, differential evolution (DE) can be employed as an approach to search for an optimum solution. It has generally been known that, with increase in characteristic value (objective function), search capability of differential evolution (DE) lowers. One of solutions is a method of increasing a population.

Optimization operation unit 126 may use, for optimization calculation, either an approach to successive search by using non-linear relation (response surface) between an input variable and an output variable or an approach to search by calculating an output value while an input variable is varied in accordance with an optimization algorithm.

Optimization operation unit 126 performs optimization calculation by using a created approximate model.

The approximate model refers to a mathematical model with which relation between input and output is approximated, and various relations between input and output can be approximated by adjusting a parameter. For example, a polynomial model, kriging, a neural network, and a radial basis function can be used for the approximate model.

Optimization operation unit 126 performs verification calculation such as cross validation of an approximate model.

Optimization operation unit 126 also calculates a characteristic value based on combination between a design variable and a characteristic value by using a finite element method without using an approximate model.

For example, differential evolution representing one of evolutionary computation approaches is used as an optimization calculation approach. A known method in which an answer set is divided into a plurality of areas along an objective function and multi-objective GA is performed for each divided answer set, such as divided range multi-objective GA (DRMOGA), neighborhood cultivation GA (NCGA), distributed cooperation model of MOGA and SOGA (DCMOGA), non-dominated sorting GA (NSGA), non-dominated sorting GA-II (NSGA2), or strength pareto evolutionary algorithm-II (SPEA II), can be employed as differential evolution (DE).

Optimization operation unit 126 searches results of optimization calculation obtained from an approximate model for an optimum solution in accordance with a condition for optimum solution search, and extracts the optimum solution.

The obtained optimum solution is stored in memory 33. The optimum solution refers to an answer which cannot be concluded as being superior to any other answer but to an answer better than which is not found among a plurality of characteristic values (objective function) in trade-off relation. In general, there are a plurality of optimum solutions as a set. For example, optimization operation unit 126 searches for an optimum solution by using differential evolution (DE).

Optimization operation unit 126 makes selection by using, for example, the pareto ranking method or the tournament method. Other than differential evolution (DE), for example, simulated annealing (SA) or particle swarm optimization (PSO) may be employed as a similar evolutionary computation approach.

In the present example, when a characteristic value is found by using a response surface determined based on a design variable and a characteristic value, that is, a design variable, a theoretical formula can also be used.

Representation control unit 130 controls an evaluation input screen and has display unit 102 show the evaluation input screen.

Figure 8:
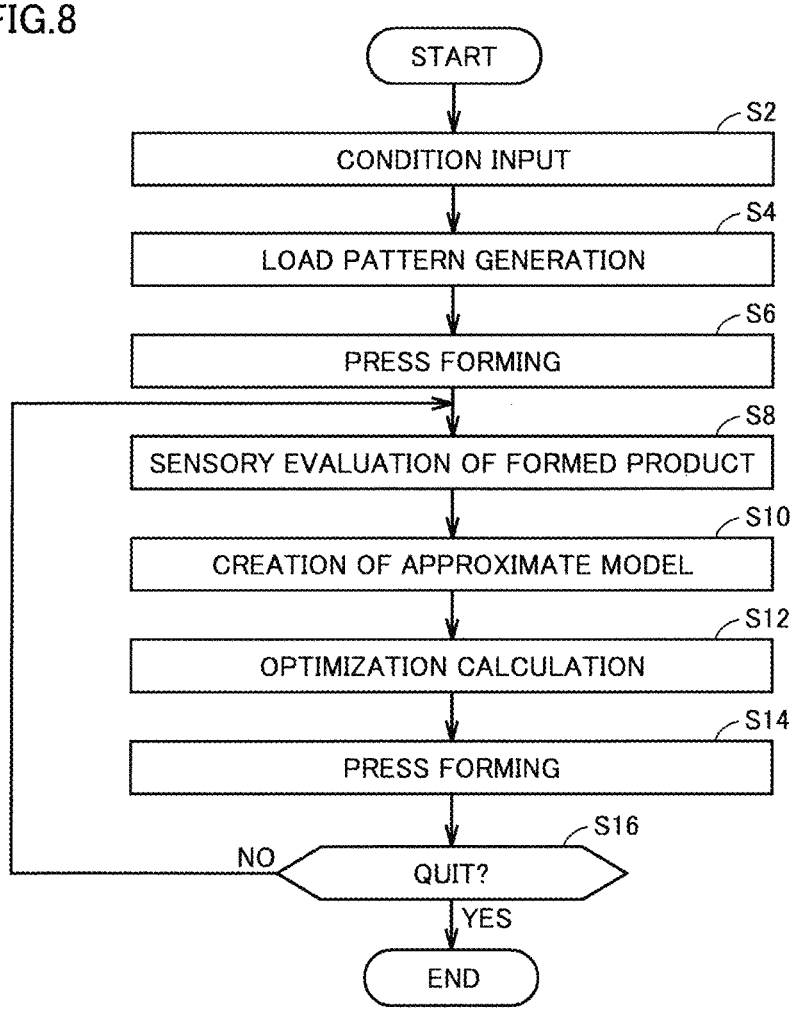
FIG. 8 is a diagram illustrating a flow of output of an optimum solution in the press apparatus based on the embodiment.

FIG. 8 is a diagram illustrating a flow of output of an optimum solution in the press apparatus based on the embodiment.

As shown in FIG. 8, a condition is input (step S2). Specifically, as described with reference to FIG. 3, a load upper limit, a load lower limit, the number of divisions of a forming stroke, and positions of division of the forming stroke L1, L2, and L3 for cushion pad 11 are input through input unit 100 as conditions.

Then, a load pattern is generated (step S4). Specifically, load pattern generator 110 generates a plurality of load patterns for cushion pad 11 described with reference to FIG. 5 based on the input conditions.

Then, press forming is performed (step S6). Press control unit 112 has press forming performed in accordance with the plurality of load patterns generated by load pattern generator 110. A plurality of sample products are thus made.

The formed products are subjected to sensory evaluation (step S8). Specifically, an operator performs sensory evaluation of quality of "execution," "wrinkle", and "crack" of each of the plurality of sample products through input unit 100, in accordance with the evaluation screen described with reference to FIG. 7. Evaluation input unit 122 obtains a plurality of pieces of characteristic data in which a plurality of load patterns for the plurality of sample products are associated with a plurality of pieces of evaluation data based on sensory evaluation by the operator, in accordance with input of evaluation by the operator.

Then, an approximate model is created (step S10). Response surface generator 124 generates a response surface (an approximate model) of an objective function based on the characteristic data obtained by evaluation input unit 122. Specifically, a response surface is created by defining the load pattern as the design variable and by defining evaluation data of "execution" as the objective function.

In addition, a response surface is created by defining the load pattern as the design variable and by defining evaluation data of "wrinkle" as a constraint condition.

Furthermore, a response surface is created by defining the load pattern as the design variable and by defining evaluation data of "crack" as a constraint condition.

Then, a synthesized response surface resulting from synthesis of the created response surfaces is created.

Then, optimization calculation is performed (step S12). Optimization operation unit 126 searches for an optimum solution in accordance with differential evolution (DE) based on the generated response surface and extracts the optimum solution.

Then, press forming is performed based on the extracted optimum solution (step S14). Press control unit 112 has press forming performed in accordance with the load pattern for cushion pad 11 based on the optimum solution.

Then, the operator determines whether or not to quit optimization processing (step S16). The operator determines whether or not the operator is satisfied with quality of press forming in accordance with the load pattern for cushion pad 11 based on the optimum solution.

When the operator determines in step S16 to quit optimization processing (YES in step S16), the operator quits optimization processing (end). When the operator determines that the operator is satisfied with quality of press forming in accordance with the load pattern for cushion pad 11 based on the optimum solution, the operator quits optimization processing.

When the operator determines in step S16 not to quit optimization processing (NO in step S16), the process returns to step S8 and sensory evaluation of a formed product is performed. Specifically, when the operator determines that the operator is not satisfied with quality of press forming in accordance with the load pattern for cushion pad 11 based on the optimum solution, the operator again performs sensory evaluation of quality of "execution", "wrinkle", and "crack" of the formed product through input unit 100 in accordance with the evaluation screen described with reference to FIG. 7.

Evaluation input unit 122 obtains characteristic data in which the load pattern for the formed product in accordance with input of evaluation by the operator is associated with evaluation data based on sensory evaluation by the operator.

Then, response surface generator 124 successively updates the synthesized response surface by adding the characteristic data on the press formed product. Thus, the response surface and the objective function are approximated to each other and accuracy in optimization calculation can be improved.

An approach to optimization will now be described.

In the present example, a response surface is created by using a radial basis function (RBF) network, and optimization is carried out.

The response surface is derived in accordance with an expression below.

$$O(x) = \sum_{j=1}^{m} w_j h_j(x)$$

x: design variable m: the number of sample points
$w_j$: weight $h_3(x)$: basis function
A Gaussian function is adopted as a basis function.

$$h_j(x) = \exp\left(-\frac{(x-x_j)^T(x-x_j)}{r_j^2}\right)$$

$x_j$: sample point $r_j$: Gaussian function radius
A Gaussian function radius is derived in accordance with an expression below.

$$r_j = \frac{d_{j,max}}{\sqrt{n}\sqrt[n]{m-1}}$$

$$j = 1, 2, \cdots, m$$

$d_{j,max}$: greatest distance from jth sample point

In order to calculate the Gaussian function radius, a design variable is scaled such that contribution by design variables are equal.

Figure 9:
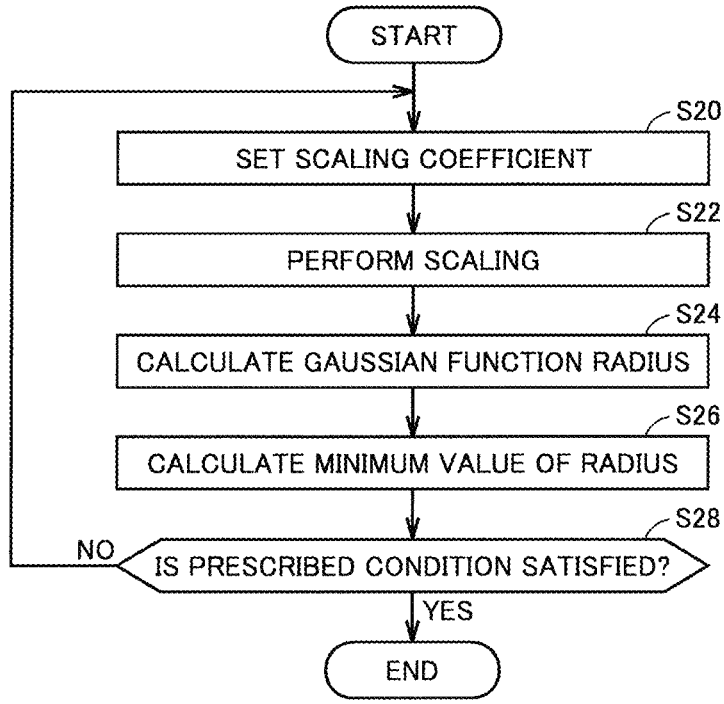
FIG. 9 is a flowchart illustrating scaling based on the embodiment.

FIG. 9 is a flowchart illustrating scaling based on the embodiment.

As shown in FIG. 9, a scaling coefficient s (>0) is set (step S20).

Then, scaling is performed (step S22).

The design variable is scaled in accordance with an expression below.

$$X_i = \frac{x_i - x_i^L}{x_i^U - x_i^L} \times S$$

$$i = 1, 2, \cdots, n$$

Then, the Gaussian function radius is calculated (step S24).

$$r_j = \frac{d_{j,max}}{\sqrt{n}\sqrt[n]{m-1}}$$

$$j = 1, 2, \cdots, m$$

Then, a minimum value of the Gaussian function radius is calculated (step S26).

$$r_{min} = \min_{1 \le j \le m}\{r_j\}$$

If $r_{min} \le 1$, $$s = \alpha \times s$$

Then, whether or not the minimum value of the Gaussian function radius satisfies a prescribed condition is determined (step S28).

When the condition of the minimum value of the Gaussian function radius $r_{min} > 1$ is satisfied in step S28, scaling ends.

When the condition of the minimum value of the Gaussian function radius $r_{min} \le 1$ is satisfied in step S28, the process returns to step S20, where scaling coefficient s×α is set and subsequent processing is repeated.

Then, a weight coefficient of the response surface is calculated.

With sample point data being employed as learning data, a weight coefficient of the response surface is set based on the least squares method.

$$E = \sum_{j=1}^{m}(y_j - O(x_j))^2 + \lambda \sum_{j=1}^{m} w_j^2 \rightarrow \min$$

$y_j$: teaching data paired with learning data $x_j$ (objective function value at sample point $x_j$)
λ: parameter for weight for avoiding excessive reaction by some elements
Consequently, weight vector w=($w_1$, $w_2$, . . . , $w_m$) is as below.

$$w = (H^T H + \Lambda)^{-1} H^T y$$

-continued $$H = \begin{bmatrix} h_1(x_1) & h_2(x_1) & \cdots & h_m(x_1) \\ h_1(x_2) & h_2(x_2) & \cdots & h_m(x_2) \\ \vdots & \vdots & \ddots & \vdots \\ h_1(x_m) & h_2(x_m) & \cdots & h_m(x_m) \end{bmatrix}$$

$$\Lambda = \begin{bmatrix} \lambda & 0 & \cdots & 0 \\ 0 & \lambda & \cdots & 0 \\ \vdots & \vdots & \ddots & \vdots \\ 0 & 0 & \cdots & \lambda \end{bmatrix}$$

$$y = (y_1, y_2, \cdots, y_m)$$

The above weight vector is substituted in this expression and the response surface is created, and then optimization is performed.

$$O(x) = \sum_{j=1}^{m} w_j h_j(x)$$
$$w = (H^T H + \Lambda)^{-1} H^T y$$

The response surface is generated by setting the weight coefficient.

Figure 10:
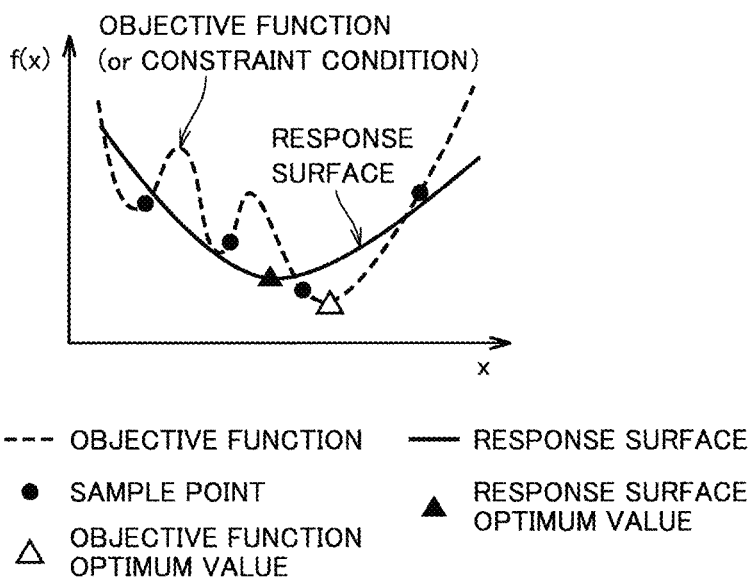
FIG. 10 is a diagram illustrating a concept of an objective function based on the embodiment.

FIG. 10 is a diagram illustrating a concept of an objective function based on the embodiment.

As shown in FIG. 10, an approximate model (a response surface) of the objective function is generated in accordance with sample points (characteristic data). A response surface optimum value representing an optimum solution is searched for in accordance with the response surface.

Figure 11:
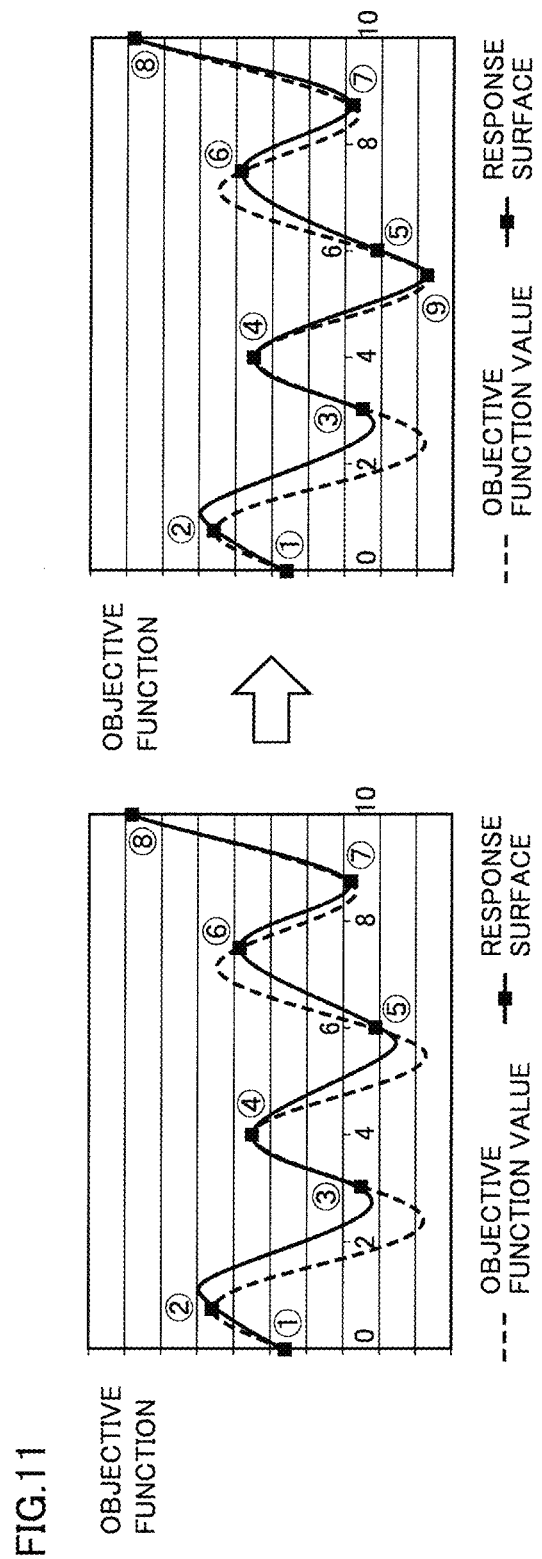
FIG. 11 is a diagram illustrating change in response surface in accordance with a plurality of sample points (characteristic data) based on the embodiment.

FIG. 11 is a diagram illustrating change in response surface in accordance with a plurality of sample points (characteristic data) based on the embodiment.

FIG. 11 shows a response surface based on eight sample points (characteristic data) in the present example. Then, an example in which a ninth sample point (characteristic data) is added is shown. As the number of sample points increases, the response surface is approximated to the objective function and an objective function optimum value and a response surface optimum value are approximated to each other.

By repeating the processing, the objective function optimum value and the response surface optimum value are approximated to each other, and an operator can perform press forming in accordance with a load pattern based on the optimum solution.

Though the present example describes control of a load pattern for cushion pad 11, limitation thereto is not particularly intended, and control of a speed pattern of slide 2 of a press apparatus is also similarly applicable.

Figure 12:
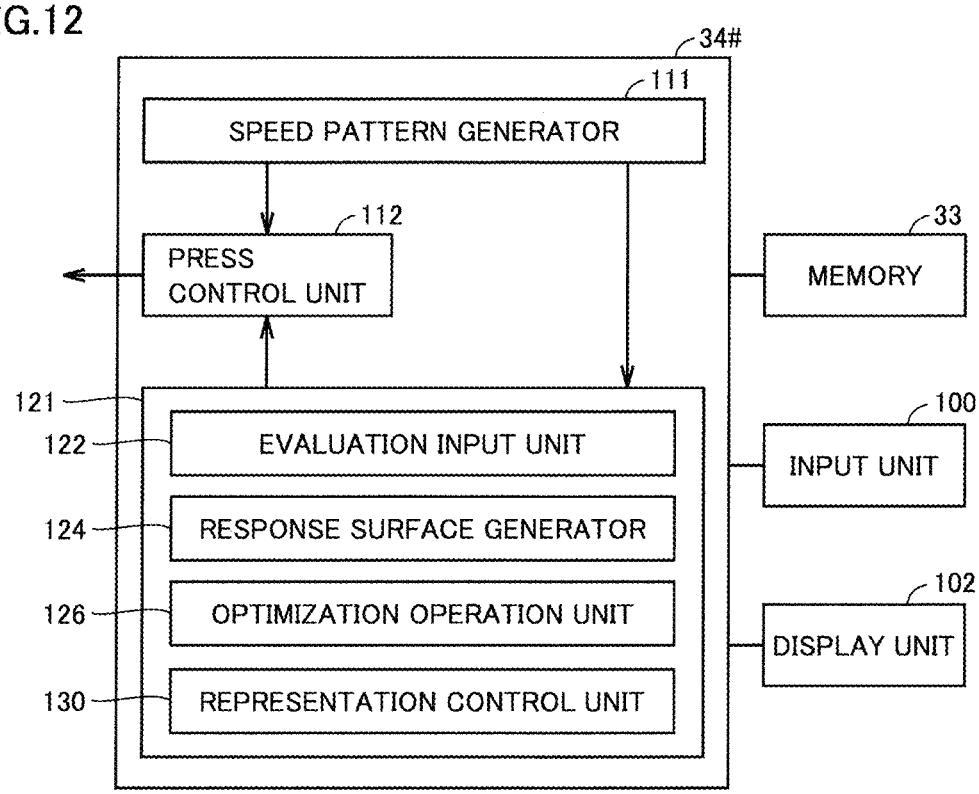
FIG. 12 is a diagram illustrating a control unit 34# and a component around the same based on another embodiment.

FIG. 12 is a diagram illustrating a control unit 34# and a component around the same based on another embodiment.

Referring to FIG. 12, memory 33, input unit 100, and display unit 102 are provided around control unit 34#.

Control unit 34# is different from control unit 34 in that a speed pattern generator 111 configured to generate a plurality of speed patterns of slide 2 is provided instead of load pattern generator 110 and an optimum speed pattern setting unit 121 is provided instead of optimum load pattern setting unit 120.

Optimum speed pattern setting unit 121 sets a speed pattern optimal for slide 2. Optimum speed pattern setting unit 121 includes evaluation input unit 122, response surface generator 124, optimization operation unit 126, and representation control unit 130. Since features are basically similar to the features described above, detailed description thereof will not be repeated.

Speed pattern generator 111 generates a plurality of speed patterns of slide 2 for forming a formed product to be employed as a sample, based on input of various conditions through input unit 100.

In the present example, conditions such as the number of divisions of a forming stroke and positions of division of the forming stroke for slide 2 are input. Conditions such as an upper limit of a speed of the slide and a lower limit of a speed of the slide can also be input.

Figure 13:
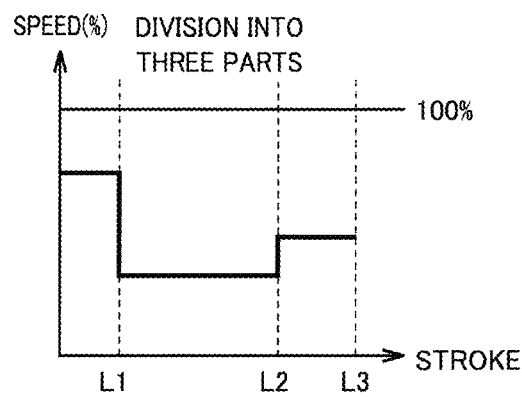
FIG. 13 is a diagram illustrating a condition input to a speed pattern generator 111 based on the embodiment.

FIG. 13 is a diagram illustrating a condition input to speed pattern generator 111 based on the embodiment.

As shown in FIG. 13, the number of divisions of a forming stroke and positions of division of the forming stroke L1, L2, and L3 for slide 2 are input as conditions.

In the present example, the number of divisions of a forming stroke is set to "three".

By inputting the conditions, a plurality of speed patterns of slide 2 are generated as described with reference to FIG. 5.

Press forming is actually performed in accordance with the plurality of speed patterns generated by speed pattern generator 111.

As described above, an operator performs sensory evaluation of press formed sample products in accordance with the plurality of speed patterns of slide 2. Specifically, three indicators are set, and sensory evaluation of quality of "execution", "wrinkle", and "crack" of sample products is performed.

Characteristic data in which a plurality of speed patterns are associated with a plurality of pieces of evaluation data based on sensory evaluation by an operator is obtained, and by using as an objective function, evaluation data with a speed pattern being defined as a design variable, a response surface of the objective function is created based on a plurality of pieces of obtained characteristic data.

Specifically, a response surface with "execution" being defined as an objective function is created.

In addition, a response surface with "wrinkle" being defined as a constraint condition is created.

Furthermore, a response surface with "crack" being defined as a constraint condition is created.

Then, a synthesized response surface resulting from synthesis of the created response surfaces is created as described above.

Then, optimization calculation for finding a best result of the objective function of the response surface as an optimum solution is performed as described above.

Through the processing, a speed pattern corresponding to the optimum solution is set and press forming is performed. The response surface is successively updated by adding characteristic data of a press formed product.

The response surface and the objective function are thus approximated to each other and accuracy can be improved. The operator can perform press forming in accordance with the speed pattern based on the optimum solution.

<Function and Effect>

A function and effect of the embodiment will now be described.

A press system in the embodiment includes a press portion and control unit 34 configured to control the press portion as shown in FIGS. 1 and 2. Control unit 34 includes load pattern generator 110 configured to generate a plurality of load patterns, input unit 100 configured to input evaluation of quality of each of a plurality of formed products formed by the press portion in accordance with the plurality of load patterns, and optimum load pattern setting unit 120 configured to set an optimum load pattern based on a plurality of evaluations of the quality input by input unit 100. Optimum load pattern setting unit 120 includes response surface generator 124 configured to create from evaluation value data based on the plurality of load patterns and the plurality of evaluations of the quality, by using as an objective function, the evaluation value data with the load pattern being defined as a design variable, a response surface of the objective function and optimization calculator 126 configured to find an optimum solution of the objective function of the response surface by optimization.

Optimum load pattern setting unit 120 sets an optimum load pattern based on evaluation of quality of each of the plurality of formed products. Therefore, a load pattern can efficiently be set with a simplified scheme without requiring complicated processing using a simulation model or an analysis tool.

Response surface generator 124 successively updates the response surface while adding evaluation value data based on evaluation of quality of the formed product formed by the press portion in accordance with the load pattern corresponding to the optimum solution obtained by optimization calculator 126.

Since an objective function optimum value and a response surface optimum value are approximated to each other by successively updating the response surface, a more accurate load pattern can be set.

Load pattern generator 110 determines a plurality of load patterns by Latin hypercube design.

Since a parameter value can evenly be set in a design variable space, a load pattern can efficiently be generated.

Response surface generator 124 creates the response surface by using a radial basis function (RBF) network.

A response surface in which change in objective function or constraint condition is approximated can readily be created.

Optimization calculator 126 performs optimization calculation by differential evolution (DE).

With the approach, an optimum value of the response surface can be found and the optimum value of the objective function can readily be calculated.

The load pattern corresponds to a die cushion load applied by the press portion. By applying the load pattern to the die cushion load, the load pattern of the die cushion can readily be set.

A press system in another embodiment includes a press portion and control unit 34# configured to control the press portion as shown in FIGS. 1 and 12. Control unit 34# includes speed pattern generator 111 configured to generate a plurality of speed patterns of a slide of the press portion, input unit 100 configured to input evaluation of quality of each of a plurality of formed products formed by the press portion in accordance with a plurality of speed patterns, and optimum speed pattern setting unit 121 configured to set an optimum speed pattern based on a plurality of evaluations of the quality input by input unit 100. Optimum speed pattern setting unit 121 includes response surface generator 124 configured to create from evaluation value data based on the plurality of speed patterns and the plurality of evaluations of the quality, by using as an objective function, the evaluation value data with the speed pattern being defined as a design variable, a response surface of the objective function and optimization calculator 126 configured to find an optimum solution of the objective function of the response surface by optimization.

Optimum speed pattern setting unit 121 sets an optimum load pattern based on evaluation of quality of each of a plurality of formed products. Therefore, a load pattern can efficiently be set with a simplified scheme without requiring complicated processing using a simulation model or an analysis tool.

Response surface generator 124 successively updates the response surface while adding evaluation value data based on evaluation of quality of the formed product formed by the press portion in accordance with the speed pattern corresponding to the optimum solution obtained by optimization calculator 126.

Since an objective function optimum value and a response surface optimum value are approximated to each other by successively updating the response surface, a more accurate load pattern can be set.

As shown in FIG. 8, a method of controlling a press apparatus including a press portion in the embodiment includes step S4 of generating a plurality of load patterns, step S8 of inputting evaluation of quality of each of a plurality of formed products formed by the press portion in accordance with the plurality of generated load patterns, and a step of setting an optimum load pattern based on a plurality of input evaluations of the quality. The step of setting an optimum load pattern includes step S10 of creating from evaluation value data based on the plurality of load patterns and the plurality of evaluations of the quality, by using as an objective function, the evaluation value data with the load pattern being defined as a design variable, a response surface of the objective function and step S12 of performing optimization calculation to find an optimum solution of the objective function of the response surface by optimization.

An optimum load pattern is set based on evaluation of quality of each of a plurality of formed products. Therefore, a load pattern can efficiently be set with a simplified scheme without requiring complicated processing using a simulation model or an analysis tool.

As shown in FIG. 11, the step of creating a response surface of the objective function includes successively updating the response surface while adding evaluation value data based on evaluation of quality of the formed product formed by the press portion in accordance with the load pattern corresponding to the optimum solution.

Since an objective function optimum value and a response surface optimum value are approximated to each other by successively updating the response surface, a more accurate load pattern can be set.

A method of controlling a press apparatus including a press portion in another embodiment includes steps of generating a plurality of speed patterns of a slide of the press portion, inputting evaluation of quality of each of a plurality of formed products formed by the press portion in accordance with the plurality of generated speed patterns, and setting an optimum speed pattern based on a plurality of input evaluations of the quality. The step of setting an optimum speed pattern includes steps of creating from evaluation value data based on the plurality of speed patterns and the plurality of evaluations of the quality, by using as an objective function, the evaluation value data with the speed pattern being defined as a design variable, a response surface of the objective function and performing optimization calculation to find an optimum solution of the objective function of the response surface by optimization.

An optimum speed pattern is set based on evaluation of quality of each of a plurality of formed products. Therefore, a speed pattern can efficiently be set with a simplified scheme without requiring complicated processing using a simulation model or an analysis tool.

The step of creating a response surface of the objective function includes a step of successively updating the response surface while adding evaluation value data based on evaluation of quality of the formed product formed by the press portion in accordance with the speed pattern corresponding to the optimum solution.

Since an objective function optimum value and a response surface optimum value are approximated to each other by successively updating the response surface, a more accurate speed pattern can be set.

The embodiment disclosed herein is illustrative and not restricted only to the contents above. The scope of the present example is defined by the terms of the claims and is intended to include any modifications within the scope and meaning equivalent to the terms of the claims.

REFERENCE SIGNS LIST 2 slide; 3a upper die; 3b lower die; 5 blank holder; 7 cushion pin; 8 bolster; 9 bed; 10 die cushion; 11 cushion pad; 12 servo motor; 33 memory; 34 control unit; 100 input unit; 102 display unit; 110 load pattern generator; 112 press control unit; 120 optimum load pattern setting unit; 122 evaluation input unit; 124 response surface generator; 126 optimization operation unit; 130 representation control unit

The invention claimed is:

1. A press system comprising:
a press portion; and
a controller configured to control the press portion,
the controller including
   a load pattern generator configured to generate a plurality of load patterns for a cushion pad based on an upper limit load, a lower limit load, and a plurality of positions of division of a forming stroke, each load pattern corresponding to a die cushion load applied by the press portion,
   an evaluation input unit configured to input evaluation of quality of each of a plurality of formed products formed by the press portion in accordance with the plurality of load patterns, and
   an optimum load pattern setting unit configured to set an optimum load pattern based on a plurality of evaluations of the quality input by the evaluation input unit,
the optimum load pattern setting unit including
   a response surface generator configured to create from evaluation value data based on the plurality of load patterns and the plurality of evaluations of the quality, by using as an objective function, the evaluation value data with the load pattern being defined as a design variable, a response surface of the objective function, and
   an optimization calculator configured to find an optimum solution of the objective function of the response surface by optimization.

2. The press system according to claim 1, wherein
the response surface generator is configured to successively update the response surface while adding the evaluation value data based on evaluation of the quality of the formed product formed by the press portion in accordance with the load pattern corresponding to the optimum solution found by the optimization calculator.

3. The press system according to claim 1, wherein
the load pattern generator is configured to determine the plurality of load patterns by Latin hypercube design (LHD).

4. The press system according to claim 1, wherein
the response surface generator is configured to create the response surface by using a radial basis function (RBF) network.

5. The press system according to claim 1, wherein
the optimization calculator is configured to perform optimization calculation by differential evolution (DE).

6. A press system comprising:
a press portion; and
a controller configured to control the press portion,
the controller including
   a speed pattern generator configured to generate a plurality of speed patterns of a slide of the press portion based on an upper limit of a speed of the press portion, a lower limit of a speed of the press portion, and a number of divisions of a forming stroke and positions of division of the forming stroke,
   an evaluation input unit configured to input evaluation of quality of each of a plurality of formed products formed by the press portion in accordance with the plurality of speed patterns, and
   an optimum speed pattern setting unit configured to set an optimum speed pattern based on a plurality of evaluations of the quality input by the evaluation input unit,
the optimum speed pattern setting unit including
   a response surface generator configured to create from evaluation value data based on the plurality of speed patterns and the plurality of evaluations of the quality, by using as an objective function, the evaluation value data with the speed pattern being defined as a design variable, a response surface of the objective function, and
   an optimization calculator configured to find an optimum solution of the objective function of the response surface by optimization.

7. The press system according to claim 6, wherein
the response surface generator is configured to successively update the response surface while adding the evaluation value data based on evaluation of the quality of the formed product formed by the press portion in accordance with the speed pattern corresponding to the optimum solution found by the optimization calculator.

8. A method of controlling a press apparatus including a press portion, the method comprising:
generating a plurality of load patterns for a cushion pad based on an upper limit load, a lower limit load, and a plurality of positions of division of a forming stroke, each load pattern corresponding to a die cushion load applied by the press portion;
inputting evaluation of quality of each of a plurality of formed products formed by the press portion in accordance with a plurality of generated load patterns; and
setting an optimum load pattern based on a plurality of input evaluations of the quality,
the setting an optimum load pattern including
   creating from evaluation value data based on the plurality of load patterns and the plurality of evaluations of the quality, by using as an objective function, the evaluation value data with the load pattern being defined as a design variable, a response surface of the objective function, and performing optimization calculation to find an optimum solution of the objective function of the response surface by optimization.

9. The method of controlling a press apparatus according to claim 8, wherein the creating a response surface of the objective function includes successively updating the response surface while adding the evaluation value data based on evaluation of the quality of the formed product formed by the press portion in accordance with the load pattern corresponding to the optimum solution.

10. A method of controlling a press apparatus including a press portion, the method comprising:

generating a plurality of speed patterns of a slide of the press portion based on an upper limit of a speed of the press portion, a lower limit of a speed of the press portion, and a number of divisions of a forming stroke and positions of division of the forming stroke;

inputting evaluation of quality of each of a plurality of formed products formed by the press portion in accordance with a plurality of generated speed patterns; and setting an optimum speed pattern based on a plurality of input evaluations of the quality, the setting an optimum speed pattern including creating from evaluation value data based on the plurality of speed patterns and the plurality of evaluations of the quality, by using as an objective function, the evaluation value data with the speed pattern being defined as a design variable, a response surface of the objective function, and performing optimization calculation to find an optimum solution of the objective function of the response surface by optimization.

11. The method of controlling a press apparatus according to claim 10, wherein the creating a response surface of the objective function includes successively updating the response surface while adding the evaluation value data based on evaluation of the quality of the formed product formed by the press portion in accordance with the speed pattern corresponding to the optimum solution.

* * * * *